United States Patent
Sousbie et al.

(10) Patent No.: US 8,158,487 B2
(45) Date of Patent: Apr. 17, 2012

(54) ANNEALING PROCESS FOR ANNEALING A STRUCTURE

(75) Inventors: Nicolas Sousbie, Grenoble (FR); Bernard Aspar, St. Ismier (FR); Thierry Barge, Chevrieres (FR); Chrystelle Lagahe Blanchard, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/011,267

(22) Filed: Jan. 21, 2011

(65) Prior Publication Data

US 2011/0183495 A1 Jul. 28, 2011

(30) Foreign Application Priority Data

Jan. 25, 2010 (FR) ..................... 10 50469

(51) Int. Cl.
*H01L 21/76* (2006.01)
*H01L 21/31* (2006.01)

(52) U.S. Cl. . 438/431; 438/770; 438/787; 257/E21.079; 257/E21.082; 257/E21.301

(58) Field of Classification Search .......... 438/431, 438/770–773, 787, 788, 795; 257/E21.079, 257/E21.082, E21.301
See application file for complete search history.

(56) References Cited

U.S. PATENT DOCUMENTS

| 7,867,920 B2 * | 1/2011 | Yamazaki et al. | 438/787 |
| 2007/0148912 A1 | 6/2007 | Morita et al. | 438/455 |
| 2009/0057811 A1 * | 3/2009 | Murakami et al. | 257/506 |
| 2009/0170287 A1 | 7/2009 | Endo et al. | 438/458 |

FOREIGN PATENT DOCUMENTS

EP 1 460 691 A1 9/2004

OTHER PUBLICATIONS

French Search Report FR 1050469 date Aug. 10, 2010.

* cited by examiner

*Primary Examiner* — Hsien Ming Lee
(74) *Attorney, Agent, or Firm* — Winston & Strawn LLP

(57) ABSTRACT

The invention relates to a process for annealing a structure that includes at least one wafer, with the annealing process including conducting a first annealing of the structure in an oxidizing atmosphere while holding the structure in contact with a holder in a first position in order to oxidize at least portion of the exposed surface of the structure, shifting the structure on the holder into a second position in which non-oxidized regions of the structure are exposed, and conducting a second annealing of the structure in an oxidizing atmosphere while holding the structure in the second position. The process provides an oxide layer on the structure.

13 Claims, 6 Drawing Sheets

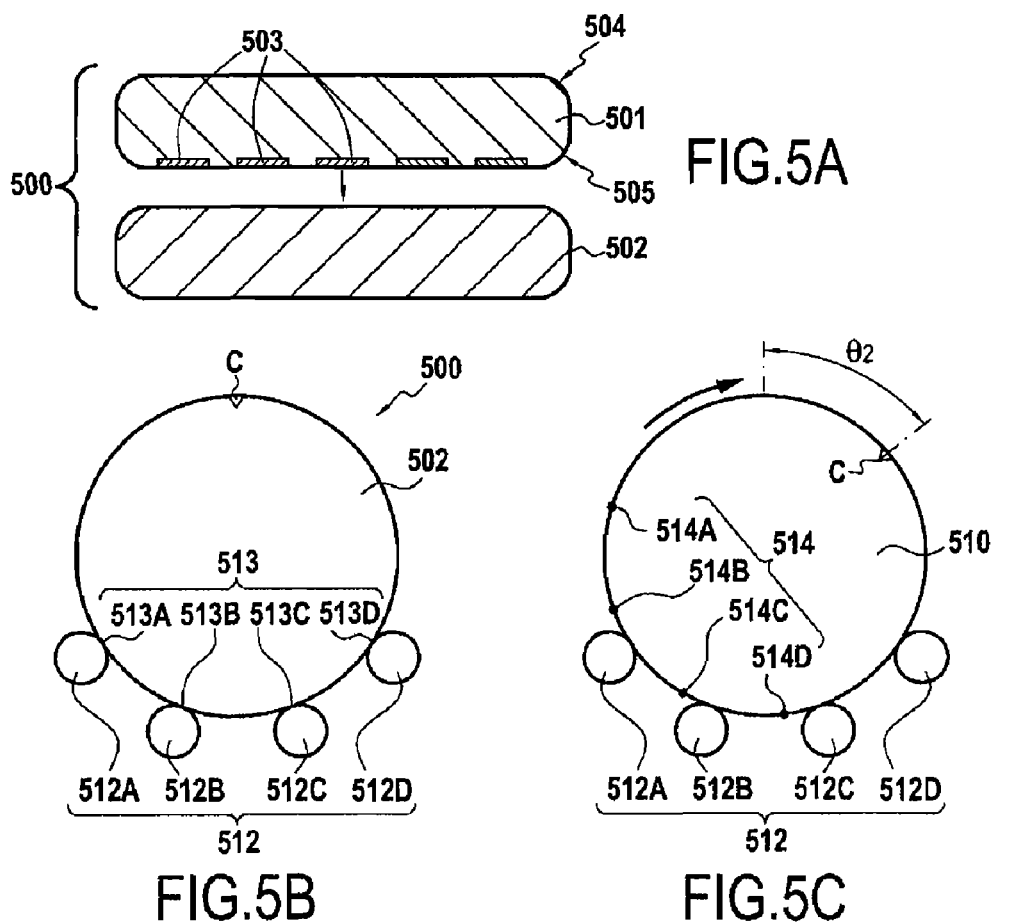
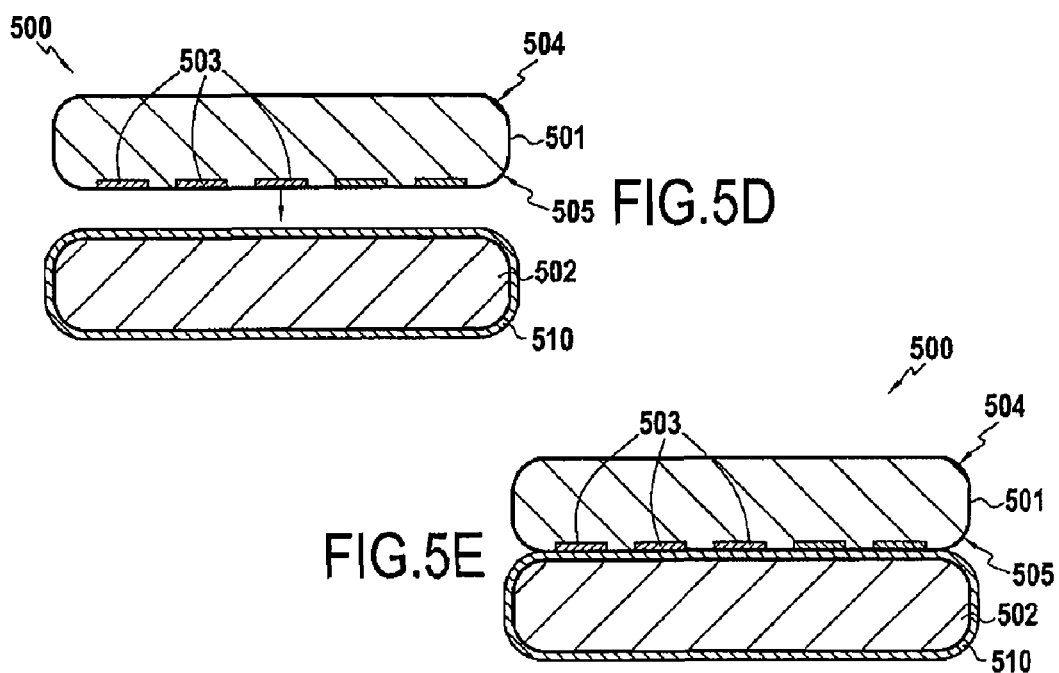

ANNEALING PROCESS FOR ANNEALING A STRUCTURE

FIELD OF INVENTION

The present invention relates to the field of annealing semiconductor structures in oxidizing atmospheres used especially during the fabrication of multilayer semiconductor substrates (also called multilayer semiconductor wafers) obtained by transferring at least one layer onto a support substrate, such as Bonded Silicon-On-Insulator (BSOI) structures.

BACKGROUND OF THE INVENTION

Fabricating substrates with oxide layers is well known in the art. An example of which is US Publication No. 2009/00170287 to Yuta Endo et al. (the '787 application). The '787 application relates to a process for fabricating an SOI substrate that uses a cleave technique to transfer a layer. Many processing steps (bonding, heat treatment, lift-off, etching, oxidation) are carried out between successive anneals so that, as a result, it is not the same structure that undergoes each anneal in the '787 application. This document discloses localized oxidations at different moments in the fabrication process.

Another example of a known process for fabricating a multilayer structure is also described with reference to FIGS. 1A to 1F.

As shown in FIGS. 1A and 1B, a composite structure 100 is formed by assembling a first wafer 101 and a second wafer 102, for example made of silicon. The first and second wafers, 101 and 102, here have the same diameter. They could however have different diameters.

An additional oxide layer (not shown) may be formed on one or both wafers, 101 and 102, before placing them in contact, especially when fabricating an SOI (silicon-on-insulator) structure.

The first wafer 101 has a chamfered edge, namely an edge comprising a top chamfer 104 and a bottom chamfer 105. The role of these chamfers is to make handling the wafers easier and to prevent edge flaking that could occur if these edges were sharp, such flakes being a source of particulate contamination on the surfaces of the wafers.

In the example described herein, the wafer assembly is produced using the direct bonding (molecular adhesion) technique, a process that is well known to those of ordinary skill in the art.

Once the bonding is completed, the composite structure 100 undergoes a stabilizing anneal. The purpose this anneal is to strengthen the bond between the first wafer 101 and the second wafer 102, and to provide these two wafers with a protective oxide cover layer. For this purpose, the stabilizing anneal is carried out in an oxidizing atmosphere so as to form an oxide layer 110 on the entire exposed surface of the composite structure 100 (FIG. 1C). The oxide layer 110 thus forms a protective layer that protects the composite structure from chemical etching, especially during subsequent processing operations.

The structure 100 is then trimmed, which comprises essentially eliminating an annular portion of the layer 106 comprising the chamfer 105 (FIGS. 1D and 1E). Such trimming is necessary because the presence of the chamfer 105 prevents good contact from being achieved between the first and the second wafers at their periphery. There is therefore a peripheral region where the transferred layer is weakly bonded, or not at all bonded, to the second wafer. After transfer of the layer, this peripheral region of the transferred layer must be removed because it is liable to break in an uncontrolled way and to contaminate the structure with undesirable fragments or particles.

Preferably, a trimming process called hybrid trimming is used. This process includes carrying out a first trimming by an entirely mechanical action or by mechanical machining (FIG. 1D), followed by a second, at least partially non-mechanical trimming for trimming the remaining thickness of the first wafer (FIG. 1E). This second trimming corresponds in general to chemical trimming that is selective with respect to the oxide layers formed on the wafer(s) 101 and/or 102. The hybrid trimming especially prevents peel-off both at the bonding interface between the transferred layer and the second wafer and in the transferred layer itself.

In the example described here, the chemical trimming comprises chemical etching or wet etching. The chemical etching solution is chosen depending on the material to be etched. In this example, for etching silicon, either of tetramethyl ammonium hydroxide (TMAH) or potassium hydroxide KOH solutions can be used, with both solutions being well known to those skilled in the art. The first wafer 101 may then be thinned so as to form a transferred layer 106 having a predetermined thickness e (FIG. 1F). This thickness e may for example be about 10 µm.

Oxidation of the composite structure 100 (FIG. 1C) before the trimming operation prevents the second wafer 102 from being chemically etched by a TMAH solution during the chemical trimming. The oxide layer 110 also protects the surface of the first wafer 101 from the trimming chemical etch, before it is thinned.

After chemical trimming, however, the appearance of defects has been observed at the edges of the composite structures. More specifically, the defects observed are nicks distributed over the edges (or edge face) of the second wafer of the composite structures. These nicks are undesirable for the fabricator since they may, for example, be the source of flakes coming from the second wafer, these flakes being liable to contaminate the exposed surface of the first wafer. More generally, these defects attest to a non-optimized fabrication process and as a result, the multilayer structures thus produced are less attractive. These defects may moreover cause various problems during supplementary technological steps on these defective composite structures, such as during the fabrication of microcomponents on the exposed surface of the first wafer.

It is therefore necessary to produce composite structures without such defects even when the process for fabricating these structures comprises one or more steps implementing chemical etches. Such chemical etches may occur especially, but not exclusively, during a trimming or thinning operation on the first wafer. The present invention now provides such structures.

SUMMARY OF THE INVENTION

The invention provides a process for annealing a structure comprising at least one wafer, with the annealing process comprising conducting a first annealing of the structure in an oxidizing atmosphere while holding the structure in contact with a holder in a first position in order to oxidize at least portion of the exposed surface of the structure, shifting the structure on the holder into a second position in which non-oxidized regions of the structure are exposed, and conducting a second annealing of the structure in an oxidizing atmosphere while holding the structure in the second position.

The non-oxidized regions of the structure typically represent regions of contact between the structure and the holder in the first position. Thus, the structure is held by the holder in the second position by contact with oxidized regions of the structure in order to expose the non-oxidized regions to the oxidizing atmosphere. In this way, the first and second annealings of the structure in the oxidizing atmosphere provides an oxide layer on the structure. The process is advantageously conducted to form a uniform oxide layer on the entire surface of the substrate.

The structure may be a heterostructure formed by bonding a first wafer to a second wafer. If so, after the second annealing, the structure may be subjected to a thinning step followed by chemical trimming step.

Alternatively, the structure may be a first wafer such that the process further comprises forming a heterostructure after the second annealing by bonding the first wafer to a second wafer. In this embodiment, before bonding the wafers, at least one microcomponent can be formed in the second wafer. The heterostructure can then be subjected to an annealing step for stabilizing the bond between the wafers. After conducting the stabilizing annealing, the structure may be subjected to a thinning step followed by chemical trimming step.

BRIEF DESCRIPTION OF THE DRAWINGS

The features and advantages of the present invention will become clear from the description given below with reference to the appended drawings that illustrate embodiments of the invention. In the figures:

FIGS. 5A to 5E show schematically a second embodiment of the invention for fabricating a heterostructure.

DETAILED DESCRIPTION OF THE PREFERRED EMBODIMENTS

Figure 1A:
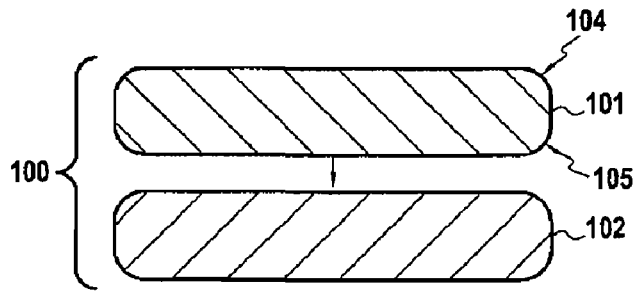
FIGS. 1A to 1F are schematic views of a stabilizing annealing process known from the prior art.

The annealing process of the invention is in particular applicable to multilayer structures or to a single wafer, the latter possibly being assembled with one or more other wafers. As indicated above, the expression "multilayer structure" is understood to mean a structure produced by transferring at least a first wafer onto a second wafer (or support substrate), such as, for example, BSOI structures.

The process according to the invention allows an oxide layer to be grown on the region or regions of the structure that are in contact with the holder during the first annealing. In this way a uniform oxide layer is formed on the entire exposed surface of the substrate or substrates subjected to the annealing process according to the invention.

This oxide layer protects the structure from subsequent chemical etches that may be carried out on the structure.

For example, this oxide layer effectively protects the structure from chemical etches that may be implemented during a thinning or trimming operation on all or part of the structure.

The oxide layer thus formed also protects the structure from chemical etches implemented during an operation of chemically treating all or part of the structure.

Thus, the annealing process prevents the formation of nicks on the structure, especially on its edges, during a chemical etch.

The holder may for example be a plurality of holding elements allowing the structure to be held in position.

Moreover, the shifting may comprise rotating the structure through a predetermined angle relative to the holder so that all the regions of the structure in contact with the support during the first annealing are no longer in contact with the holder after the shifting.

In this way it is possible to grow an oxide layer on all the regions of the structure that were in contact with the holder during the first annealing. This oxide layer is advantageous in that it protects all of the structure from the chemical etches that may be subsequently implemented. It is thus possible to prevent the formation of nicks on the surface of the structure when a chemical etch is implemented later on.

The angle through which the structure is rotated during the shifting may for example be between 40° and 90°.

The invention further comprises of bonding a first wafer to a second wafer to form the structure.

The process for fabricating the structure in this embodiment forms a heterostructure, comprised of a first wafer and a second wafer, to be produced without nicks being formed on the second wafer during the chemical trimming.

In particular, this process prevents the formation of nicks on the edges of the second wafer.

The expression "chemical trimming" is understood here and after to mean a trimming operation which implements at least one chemical etch.

The anneal carried out on the structure is preferably carried out in such a way that all the regions of the second wafer in contact with the holder during the first annealing are no longer in contact with the holder after the shifting. In this way, a protective oxide layer is formed over the entire exterior surface of the second wafer, this oxide layer protecting the second wafer from chemical etches that may be subsequently implemented.

Moreover at least one of the following steps may be carried out after the structure has been annealed for providing uniformity of thickness and outline of the oxide layer:

a thinning step, for thinning said first wafer; and a chemical trimming step, for trimming said first wafer.

Another embodiment of the invention comprises bonding a first wafer to a second wafer to form the structure, wherein before the bonding, the second wafer is annealed according to the annealing process defined in one of the above-mentioned embodiments.

This process for fabricating the structure allows an oxide layer to be formed on the surface of the second wafer; this layer effectively protecting the second wafer from chemical etches.

This embodiment may further comprise, before the bonding of the wafers, forming at least one microcomponent in the first wafer.

This process is advantageous because the first wafer does not undergo the first and second annealings. In this way, the components formed beforehand in the first wafer are not damaged during the first and second anneal ings.

This embodiment may further comprise another annealing for stabilizing or strengthening the bonding interface between the wafers of the structure.

This annealing for stabilizing or strengthening the bonding interface allows the bond between the first and second wafer to be strengthened.

Moreover, at least one of the following steps may be carried out after this anneal for stabilizing or strengthening the bonding interface:

a thinning step, for thinning said first wafer; and
a chemical trimming step, for trimming said first wafer.

The oxide layer formed on the second wafer thus serves as protection from chemical etches implemented especially during subsequent thinning and/or chemical trimming steps.

The present invention is generally applicable to an annealing carried out in several steps on a structure comprising at least one wafer.

The wafer or wafers making up the structure generally has/have a circular outline and may have various diameters, for example 100 mm, 200 mm and 300 mm. However, the wafers may also be of any shape, such as rectangular for example.

When the structure comprises of multiple wafers, a composite structure, or heterostructure, is fabricated. Such is made by bonding a first wafer to a second wafer that acts as the support substrate for the first wafer. Thus the terms heterostructure, composite structure and structure are used interchangeably herein.

As indicated above, the appearance of nicks on the edges of composite structures were noticed, when the structures have undergone a chemical etch, such as during a trimming or a thinning operation implementing a chemical phase, where the structure had previously undergone a standard stabilizing anneal in an oxidizing atmosphere. These nicks were especially observed on the edges of the second wafer of the composite structure.

An in-depth study of these nicks allowed the mechanism forming these defects to be demonstrated and a process for preventing their formation to be developed.

The mechanism that causes these defects will now be described with reference to FIGS. 2A to 2C.

Figure 1B:
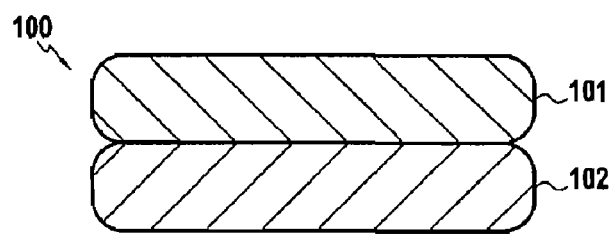
Figure 1C:
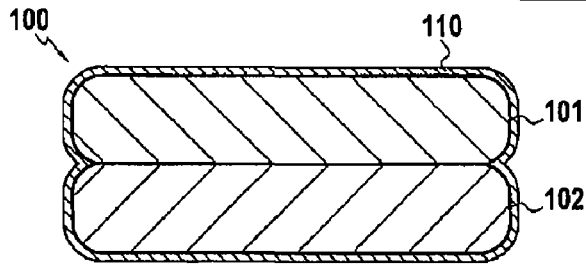
Figure 2A:
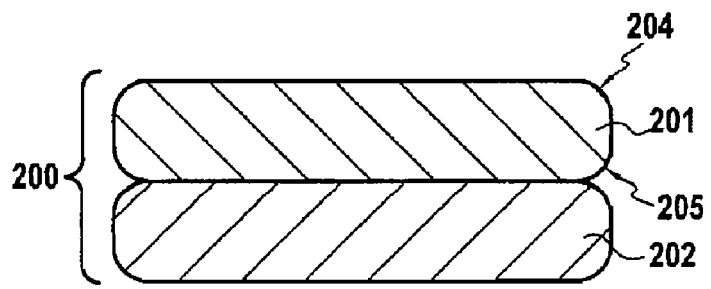
FIGS. 2A to 2C illustrate schematically the mechanism forming the nicks on the edges of a heterostructure during its fabrication process.

FIG. 2A shows an exemplary composite structure similar to that described in FIG. 1B, namely a composite structure 200 formed by assembling a first wafer 201 and a second wafer 202.

Preferably at least one of the two wafers 201 and 202 has been oxidized before bonding. This oxidation makes it possible in particular for there to be an intermediate oxide layer between the two wafers once the bonding is completed. In the example described here, the first wafer 201 is oxidized before bonding so as to form an oxide layer (not shown in the figures) over the entire surface of the first wafer.

In the example described here, the two wafers are made of silicon and the wafers are assembled using the technique of direct bonding, well known to those skilled in the art. Other bonding techniques can however be used, such as for example anodic, metallic or adhesive bonding.

As a reminder, the principle of direct bonding is based on direct contact between two surfaces—that is to say with no specific material (adhesive, wax, braze, etc.) being used. To carry out such an operation, it is necessary for the bonding surfaces to be sufficiently smooth, particle and contamination-free, and for said surfaces to be placed so close that contact is initiated. Typically a distance of less than a few nanometers is required. In this case, the attractive forces between the two surfaces are strong enough that direct bonding occurs, i.e. bonding induced by the Van der Waals forces between the atoms or molecules of the two surfaces to be bonded.

Moreover, the first wafer 201 has a chamfered edge, namely an edge comprising a top chamfer 204 and a bottom chamfer 205. In FIG. 2A the wafers have rounded chamfers. However, the wafers may have various forms of chamfers or fillets, such as a bevel.

Figure 2B:
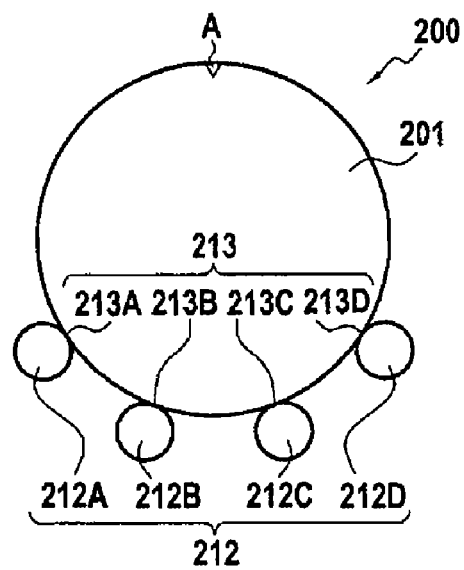

FIG. 2B shows schematically the composite structure 200 seen from the side of the first wafer 201. The reference position "A" shown at the edge of the first wafer 201 corresponds for example to a flat or a notch.

The composite structure 200 is placed on a holder 212 (sometimes called a boat) so as to continue with a standard anneal in an oxidizing atmosphere. The annealing here is a stabilizing anneal that has the objective of strengthening the bond between the first wafer 201 and the second wafer 202 and of forming a protective oxide layer.

In this example, the holder 212 comprises four holding elements 212A, 212B, 212C and 212D configured to hold the composite structure 200 in position. The holding elements are in contact with the edges (or edge-face) of the composite structure 200 and more particularly in contact with the edges (or edge-face) of the second wafer 202. The edge portions of the second wafer 202 in contact with the holding elements are referenced by the contact regions 213A, 213B, 213C and 213D, respectively (and denoted collectively as contact regions 213).

The composite structure 200 and its holder 212 are placed in an oven or any other piece of equipment designed to carry out an annealing (not shown in the figures). A stabilizing anneal is carried out on the composite structure 200 at a temperature T1 of between, for example, 900° C. and 1200° C., typically at 1100° C., for two hours.

The anneal forms an oxide layer on the exposed surface of the first wafer 201 and of the second wafer 202.

Figure 1D:
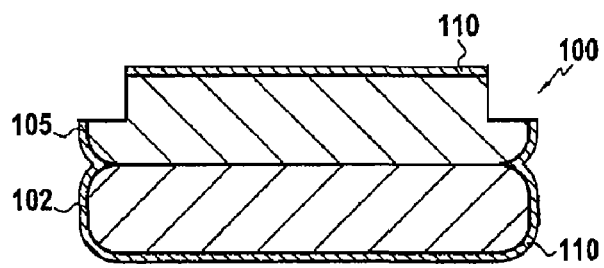
Figure 1E:
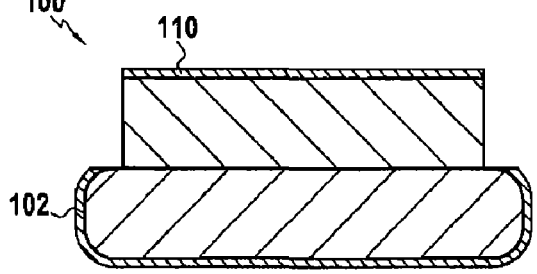
Figure 1F:
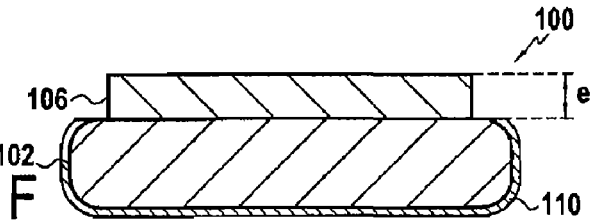

Next, a hybrid trimming step is carried out on the first wafer 201 as described with reference to FIGS. 1D and 1E. In the example described here, the hybrid trimming comprises a first partial, mechanical trimming using a grinding wheel or a blade followed by a selective chemical etching for etching the first wafer using a TMAH etching solution.

This trimming operation allows the excess part at the edge of the first wafer 201 to be removed without damaging the second wafer 202. It is possible to preserve the second wafer 202 because the oxide layer (not shown) intermediate between the two wafers acts as a stop layer for the chemical etching. The chemical etching is thus stopped at the periphery of the first wafer 201 on the oxide layer located at the bonding interface between the two wafers.

Once the trimming is completed, the first wafer 201 may be thinned so as to form a transferred layer 206 having a predetermined thickness e, for example of about 10 μm.

Thinning is carried out using a grinding wheel or any other tool capable of mechanically wearing away (or grinding) the material of the first wafer.

Figure 2C:
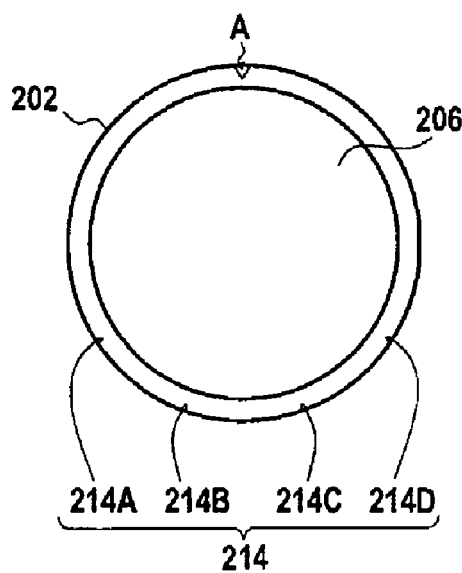

FIG. 2C shows schematically the structure 200 once the stabilizing anneal, the hybrid trimming and the thinning have been carried out.

The applicant noticed the appearance of nicks 214A, 214B, 214C and 214D (collectively reference 214) on the edge of the second wafer 202 after the TMAH chemical etch. The distribution of these defects along the edge of the second wafer 202 corresponds to the positions of the abovementioned contact regions 213.

In fact, during the stabilizing anneal of the composite structure 200 an oxide layer ($SiO_2$ in the present example) forms on all the exposed surface of the composite structure 200, except in the contact regions 213. This is because, during the stabilizing anneal, the holding elements 212A to 212D locally mask the edge of the second wafer 202 so that the contact regions are not covered by an oxide layer.

Added to this masking effect may be another effect, namely the possible deterioration of the oxide on the structure at the contact points (lift-off, scratching during removal or other movements of the wafer, etc.). The holding elements 212 may in fact locally damage the preliminary oxide layer formed on the first wafer 201 (or on the second wafer 202) before bonding and/or before the oxide layer that forms near the contact points 213 during the stabilizing anneal.

As the contact regions 213 of the first wafer 201 have no protective oxide layer, these regions are directly subjected to the chemical etching action of the TMAH solution during the thinning and/or chemical trimming. The chemical etching of the contact regions 213 then generates the nicks 214. The nicks 214A, 214B, 214C and 214D have thus been observed on the second wafer 202 in the positions of the contact regions 213A, 213B, 213C and 213D, respectively. The larger the regions not protected by the oxide are, the greater the etching effect of the TMAH solution.

These surface defects generated on the edge face of the second wafer 202 are prejudicial for the reasons already mentioned above.

For this purpose, the present invention proposes to carry out an anneal in several steps, shifting the structure on the support between two consecutive annealings so as to prevent the appearance of these nicks especially on the edge face (or edges) of the second wafer.

One particular implementation of the annealing process and a first process for fabricating a heterostructure according to the invention will now be described with reference to FIGS. 3A to 3D and 4.

Figure 3A:
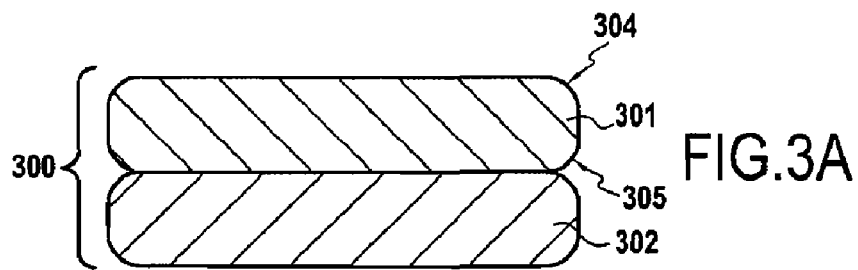
FIGS. 3A to 3D show schematically a first embodiment of the invention for fabricating a heterostructure.

As illustrated in FIG. 3A, the first wafer 301, having a top chamfer 304 and a bottom chamfer 305, is firstly bonded to a second wafer 302 that also has chamfered edges, so as to form a composite structure 300 (step E1).

In the example described here, the first and second wafers 301 and 302 are made of silicon. The wafers may however be made of other materials.

The first wafer 301 and/or the second wafer 302 may preferably be covered before bonding, with an oxide layer (not shown in the figures), in the context, for example, of the fabrication of BSOI multilayer structures.

In the example described here, the wafers are assembled using direct bonding. However, as indicated above, other types of bonding may also be envisaged.

Figure 3B:
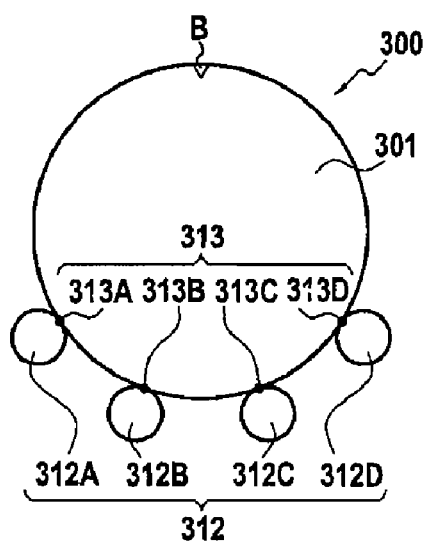

FIG. 3B shows schematically the composite structure 300 seen from one side of the first wafer 301. The reference position "B" shown at the edge of the first wafer 301 corresponds for example to a flat or a notch.

The composite structure 300 is placed on the holder 312. In this first position, the four holding elements 312A, 312B, 312C and 312D of the holder 312 are thus in contact with the contact regions 313A, 313B, 313C and 313D, respectively (collectively denoted as contact regions 313), of the second wafer 302. In this example, the contact regions 313 are distributed along the edge of the second wafer 302.

However, it is possible to envisage the contact regions being located for example on the backside of the second wafer 302.

The composite structure 300 and its holder 312 are then placed in an oven or any other piece of equipment (not shown in the figures) allowing a first annealing to be carried out on the composite structure 300 in an oxidizing (dry or wet) atmosphere (step E2).

In this example, the first annealing is carried out at a temperature T2 of between 1000° C. and 1200° C. This first annealing serves as stabilizing anneal for the composite structure 300 since it allows the bond between the first wafer 301 and the second wafer 302 to be strengthened.

Furthermore this first anneal allows an oxide layer 310 to grow on the exterior surface of the composite structure 300 and in particular on the exterior surface of the second wafer 302. The expression "exterior surface of the second wafer" is here understood to mean the entire surface of the second wafer apart from the bonding interface.

The purpose of this oxide layer is to protect the exterior surface of the second wafer 302 from subsequent chemical etches, especially during thinning and/or chemical trimming operations on the first wafer 301.

In the case of fabricating a BSOI multilayer structure, the oxide layer 310 thus formed may reach a thickness for example of about 1 µm.

Once the first annealing E2 is completed, the composite structure 300 is removed from the oven. An oxide layer 310 is then present over the entire exterior surface of the composite structure 300, apart from the contact regions 314 distributed along the edge of the second wafer 302.

It should be noted that edge regions of the first wafer may also be in contact with the holder during the first annealing. In this case, these regions also have no protective oxide layer after the first annealing E2.

Figure 3C:
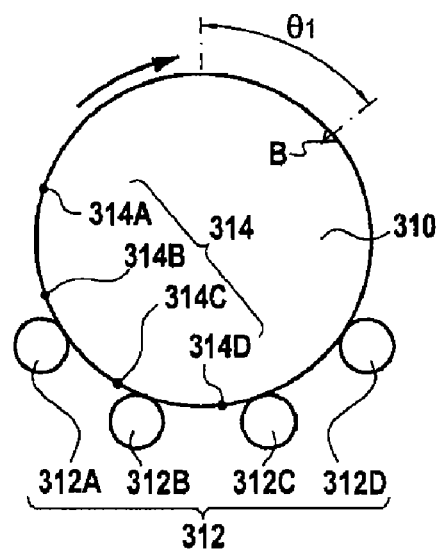

As illustrated in FIG. 3C, the composite structure 300 on the holder is then shifted by rotating it through a predetermined angle $\theta_1$ with respect to the holder 312 (step E3). This rotation may be carried out manually or by using a suitable positioning device (an aligner for example). The composite structure 300 is thus positioned on its holders 312 in a second position angularly offset by an angle $\theta_1$ with respect to the first position (FIG. 3B).

Once the rotation has been carried out, the contact regions 313 of the second wafer 302 are no longer in contact with the holding elements 312.

The angle of rotation $\theta_1$ is therefore chosen depending on the geometry of the holder 312 used and, more particularly, depending on the placement of the holding elements 312A to 312D along the edge of the second wafer 302.

In one embodiment of the invention, the angle of rotation $\theta_1$ is between 40° and 90°.

In the example described here in FIG. 3C, the composite structure 300 is turned through an angle of rotation $\theta_1$ of about 40°.

The composite structure 300 and its holder 312 are then put back in an oven (or any other suitable piece of equipment) so as to continue with a second annealing in an oxidizing (dry or wet) atmosphere (step E4).

This second annealing is carried out at a temperature T3 of between 900° C. and 1200° C., for example.

This second annealing E4 allows an oxide layer to grow on the former (unoxidized) contact regions 314 of the second wafer 302. Such an oxidation is possible because the holding elements of the holder 312 no longer protect the contact regions 314 from the oxidizing atmosphere.

As necessary, this second annealing also allows the surface of the regions of the first wafer 301 that were in contact with the support 312 during the first annealing E2 to be oxidized.

It should be noted that it is not necessary to grow an oxide layer as thick as that grown during the first stabilizing annealing. The second annealing E4 may be configured so as to form a layer a few hundreds of nanometers thick on the former contact regions 314.

In the context of a process for fabricating a BSOI multilayer structure for example, the second annealing E4 may be carried out at a temperature T3=950° C. so as to form an oxide layer about 500 nm thick on the former contact regions 314.

After the second annealing E4, an oxide layer is then present on the entire exterior surface of the composite structure 300 and in particular on the entire exterior surface of the second wafer 302 (including the edge of the second wafer 302)

Figure 3D:
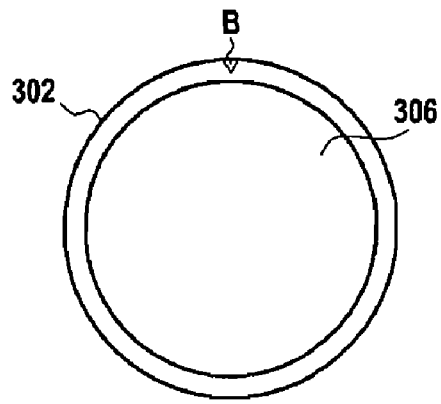
Figure 4:
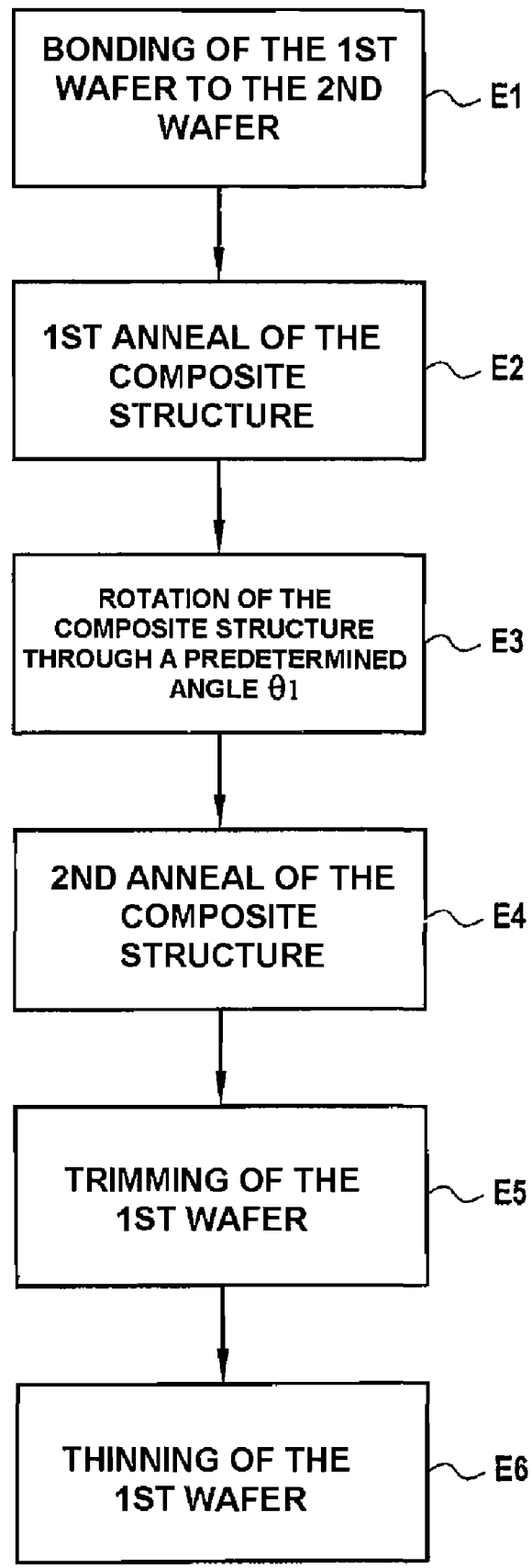
FIG. 4 shows, in the form of a flow chart, the steps of the first process for fabricating a heterostructure illustrated in FIGS. 3A to 3D.
Figure 6:
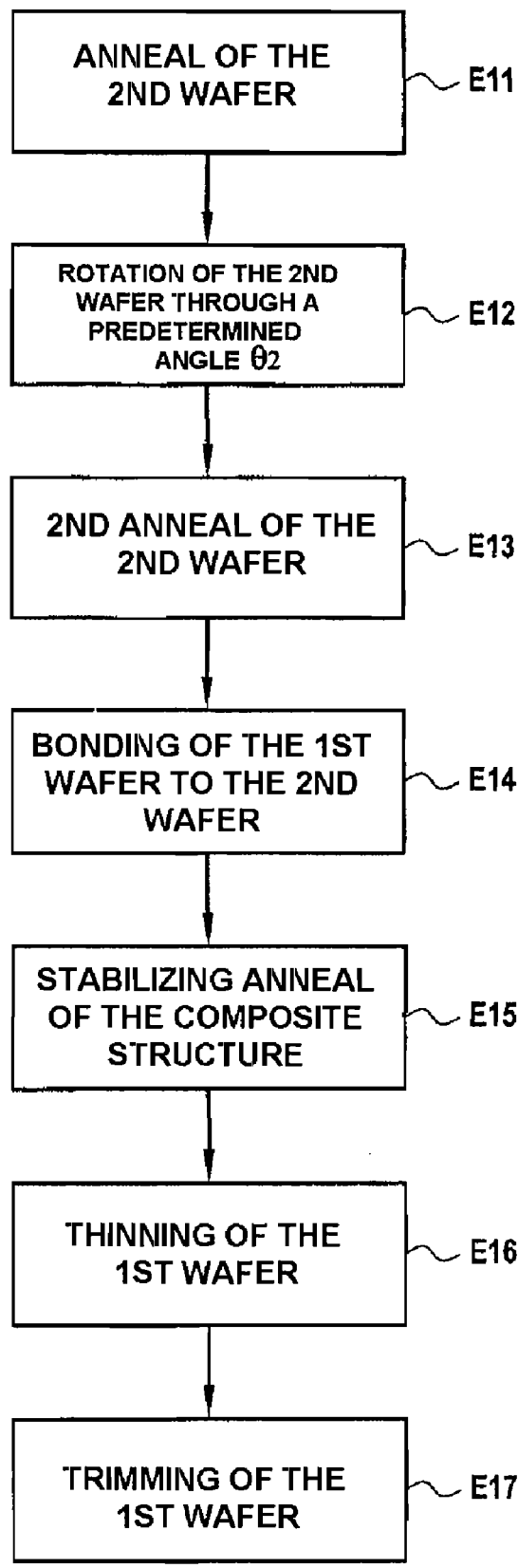
FIG. 6 shows, in the form of a flow chart, the steps of the second process for fabricating a heterostructure illustrated in FIGS. 5A to 5C.

In the example described here, the process then continues with the hybrid trimming (step E5) and then with the thinning (step E6) of the first wafer (FIG. 3D).

The hybrid trimming operation (step E5) comprises a mechanical first trimming followed by a chemical trimming, as explained with reference to FIGS. 1D and 1E.

More particularly, the mechanical trimming allows the top chamfered edge 304 to be removed from the first wafer 301. Once the mechanical trimming is completed, the annular portion remaining on the periphery of the first wafer 201 is no longer protected by the oxide. It is then possible to continue with the chemical trimming of this remaining annular portion using a chemical etching solution, this step allowing the bottom chamfered edge 305 to be removed from the first wafer 301. In the example described here, a TMAH solution is used to etch the silicon of the first wafer. Other chemical etching solutions may however be envisaged, these being chosen especially depending on the composition of the first wafer to trimmed. In certain cases, a KOH solution, well known to those skilled in the art, is used.

The oxide layer 310 effectively protects the entire second wafer 302 from the chemical etch implemented during the chemical trimming and from chemical etches that may be implemented in other technological steps during the fabrication of the composite structure (especially during the fabrication of microcomponents on the exposed surface of the first thinned wafer).

Once the trimming operation has been carried out, the first wafer 301 is thinned in an analogous way to the composite structure 200 (step E6). Thus a transferred layer 306 having a predetermined thickness is formed on the second wafer 302, this thickness possibly reaching about 10 μm for example (FIG. 3D). This thickness is measured between the top side and the bottom side of the first wafer, away from the chamfered edge.

A second embodiment of the invention for fabricating a heterostructure will now be described with reference to FIGS. 5A to 5E and 6.

FIG. 5A shows a first wafer 501 and a second wafer 502. The first wafer 501 is different from the first wafer 301 described in FIG. 3A in that it further comprises microcomponents 503 on one of its sides. In addition, the first wafer 501 is preferably an SOI wafer comprising a buried insulating layer (not shown in the figures) corresponding, for example, to a buried layer of silicon oxide or silicon nitride or, alternatively, to a multilayer stack of these materials.

The second wafer comprises a reference position "C" on the edge of one of its sides.

The expression "microcomponents" is understood here to mean any elements made using materials different from that of the first wafer. These microcomponents correspond especially to elements forming all or part of an electronic component or a plurality of electronic microcomponents. They may for example be active or passive components, simple contacts or interconnects or even simple cavities.

The first wafer may especially comprise microcomponents in the case of 3D-integration that requires the transfer of one or more layers of microcomponents onto a final support substrate, or even in the case of transferring circuits, as for example in the fabrication of backside-illuminated imagers.

Of course, when such microcomponents are present they must be able to withstand the oxidation heat treatment according to the invention. This is the case for example for cavities.

In this second embodiment, the annealing according to the invention is carried out only on the second wafer 502.

Steps E11, E12 and E13 differ therefore from steps E2, E3 and E4, respectively, in that only the second wafer 502 undergoes a first annealing followed by a rotation and a second annealing.

More precisely, the second wafer 502 is placed on a holder (FIG. 5B) and a first annealing E11 in an oxidizing atmosphere is carried out on the second wafer 502, in an analogous way to step E2 described above. This first annealing is carried out at a temperature T4.

As illustrated in FIG. 5C, the second wafer 502 is then rotated through an angle $\theta_2$ with respect to its holder (step E12), in an analogous way to step E3 described above.

Once the rotation has been carried out, a second annealing E13 is carried out on the second wafer 502 in an oxidizing atmosphere, in an analogous way to step E4 described above. This second annealing is carried out at a temperature T5.

After steps E11 to E13, a protective oxide layer 510 is present over the entire surface of the second wafer 502. This oxide layer covers in particular the regions of the second wafer 502 that were in contact with the holder during the first annealing E11 (FIG. 5D).

Next, the first wafer 501 is bonded to the second wafer 502 (step E14), so that the microcomponents 503 are located at the bonding interface between the two wafers (FIG. 5E). The wafer 501 may have been provided with a smoothing layer (made of planarized $SiO_2$ for example) so as to supply a more suitable contact surface.

In the example described here, the assembly is carried out using direct bonding. As explained above, other assembly techniques may however be envisaged.

The second embodiment ensures the microcomponents 503 of the first wafer 501 do not undergo the first and second annealings of the invention. This is because the high temperatures that are involved during these annealings, they are liable to irreversibly damage the microcomponents 503.

In this second embodiment there is therefore no protective oxide layer on the exterior surface of the first wafer 501. The first embodiment also differs from the second embodiment in that an oxide layer is present at the bonding interface between the first wafer 501 and the second wafer 502.

Once the bonding is completed, the composite structure 500 thus formed undergoes a consolidation annealing that has the objective of strengthening the bond between the first wafer 501 and the second wafer 502 (step E15). This annealing is carried out at a temperature T6 which is lower than the temperatures T4 and T5 during the first and second annealings E11 and E13. The temperature T6 is chosen in particular so as to not damage the microcomponents 503 of the first wafer 501. It may be annealed between 400° C. and 500° C. for 30 minutes to 4 hours.

In the example described here, thinning (step E16) is then carried out comprising a first, mechanical (grinding) followed by a chemical treatment that is selective with respect to the buried insulating layer of the wafer 501. An optional trimming (E17) for trimming the first wafer 501 may then be carried out.

The oxide layer 510 allows the entire surface of the second wafer 502 to be effectively protected from chemical etches especially implemented during thinning, and optionally trimming steps.

Moreover, in certain cases it may be necessary to carry out more than one shifting (rotating) of the composite structure so as to allow all the regions of the second wafer and/or of the structure that were in contact with the holder during the first annealing to be oxidized. This may be the case, for example, when the contact regions represent a substantial portion of the edge of the second wafer and/or structure.

According to another embodiment of the invention, a first annealing, conforming to step E2 (or E11), is carried out straight away.

Next N rotations (N being an integer greater than or equal to 2), with each rotation are followed by an annealing analogous to the second annealing E4 (or E13) as described above. Each second annealing is configured to grow an oxide layer on at least some of the contact regions that are still unoxidized.

It is also conceivable for the shifting of the invention to comprise shifting the structure relative to the holder in other ways, such as a translational movement for example. The latter can possibly be combined with a rotational movement.

What is claimed is:

1. A process for annealing a structure that includes at least one wafer, wherein the process comprises:
   conducting a first annealing of the structure in an oxidizing atmosphere while holding the structure in contact with a holder in a first position in order to oxidize at least a portion of an exposed surface of the structure;
   shifting the structure on the holder into a second position in which non-oxidized regions of the structure are exposed; and
   conducting a second annealing of the structure in the oxidizing atmosphere while holding the structure in the second position.

2. The process of claim 1, wherein the shifting includes rotating the structure through an angle relative to the holder.

3. The process of claim 2, wherein the angle through which the structure is rotated is between 40° and 90°.

4. The process of claim 1, wherein the non-oxidized regions of the structure represent regions of contact between the structure and the holder in the first position.

5. The process of claim 1, wherein the structure is held by the holder in the second position by contact with oxidized regions of the structure.

6. The process of claim 1, wherein the first and second annealings of the structure in the oxidizing atmosphere provides an oxide layer on the structure.

7. The process of claim 6, which is conducted to form a uniform oxide layer on the entire surface of the structure.

8. The process of claim 1, wherein the structure is a heterostructure formed by bonding a first wafer to a second wafer.

9. The process of claim 8, which further comprises, after the second annealing:
   thinning the first wafer; and
   chemical trimming the first wafer.

10. The process of claim 1, wherein the structure is a first wafer and which further comprises forming a heterostructure after the second annealing by bonding the first wafer to a second wafer.

11. The process of claim 10, which further comprises before bonding the wafers, forming at least one microcomponent in the second wafer.

12. The process of claim 10, which further comprises annealing the heterostructure for stabilizing the bond between the wafers.

13. The process of claim 12, which further comprises after conducting the stabilizing annealing:
   thinning the first wafer; and
   chemical trimming the first wafer.

* * * * *